United States Patent
Cideciyan et al.

(10) Patent No.: US 9,455,749 B2
(45) Date of Patent: *Sep. 27, 2016

(54) COMBINATION ERROR AND ERASURE DECODING FOR PRODUCT CODES

(71) Applicant: International Business Machines Corporation, Armonk, NY (US)

(72) Inventors: Roy D. Cideciyan, Rueschlikon (CH); Robert A. Hutchins, Tucson, AZ (US); Thomas Mittelholzer, Zurich (CH); Keisuke Tanaka, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/850,883

(22) Filed: Sep. 10, 2015

(65) Prior Publication Data

US 2016/0006460 A1  Jan. 7, 2016

Related U.S. Application Data

(63) Continuation of application No. 13/961,839, filed on Aug. 7, 2013, now Pat. No. 9,166,627.

(51) Int. Cl.
*H03M 13/00* (2006.01)
*H03M 13/29* (2006.01)
(Continued)

(52) U.S. Cl.
CPC ....... *H03M 13/2909* (2013.01); *H03M 13/293* (2013.01); *H03M 13/2957* (2013.01); *H03M 13/373* (2013.01); *H03M 13/1515* (2013.01); *H03M 13/618* (2013.01)

(58) Field of Classification Search
CPC ... G11B 20/02; G11B 20/1809; G11B 7/007; G11B 20/1833; G11B 2020/1836; H03M 13/2909; H03M 13/293; H03M 13/1102; H03M 13/1515; H03M 13/03; H03M 13/356; H03M 13/3746; H03M 13/09; H03M 13/2957; H03M 13/29; G06F 11/1012; H04L 1/0061

See application file for complete search history.

(56) References Cited

U.S. PATENT DOCUMENTS 6,047,395 A   4/2000   Zook
6,048,090 A   4/2000   Zook (Continued)

FOREIGN PATENT DOCUMENTS

CN   101228583 A   7/2008

OTHER PUBLICATIONS

Al-Shaikhi, et al., "Modified Algorithm for Hard Decision Decoding of Product Codes," Wireless Communications and Networking Conference, vol. 3, Mar. 2004, pp. 1760-1763.

Changuel, et al., "Iterative Decoding of Block Turbo Codes Over the Binary Erasure Channel," IEEE International Conference on Signal Processing and Communications, Nov. 2007, pp. 1539-1542.

(Continued)

*Primary Examiner* — Guerrier Merant
(74) *Attorney, Agent, or Firm* — Zilka-Kotab, PC

(57) ABSTRACT

In one embodiment, a method for combination error and erasure decoding for product codes includes receiving, using a hardware processor, captured data. The method also includes generating, using the hardware processor, erasure flags for the captured data and providing the erasure flags to a C2 decoder. Moreover, the method includes setting a stop parameter to be equal to a length of C1 codewords in a codeword interleave used to encode the captured data. In addition, the method includes selectively performing, in an iterative process, error or erasure C1 decoding followed by error or erasure C2 decoding until decoding is successful or unsuccessful. Other methods and computer program products are described in more embodiments.

20 Claims, 6 Drawing Sheets

(51) Int. Cl.
*H03M 13/37* (2006.01)
*H03M 13/15* (2006.01)

(56) References Cited

U.S. PATENT DOCUMENTS

| | | |
|---|---|---|
| 6,272,659 B1 | 8/2001 | Zook |
| 7,003,065 B2 | 2/2006 | Homol et al. |
| 7,441,175 B2 | 10/2008 | Yeh et al. |
| 8,046,660 B2 | 10/2011 | Wu et al. |
| 8,214,718 B2 | 7/2012 | Antonakopoulos et al. |
| 9,166,627 B2 * | 10/2015 | Cideciyan ......... H03M 13/2909 |
| 2003/0070131 A1 | 4/2003 | Fujita et al. |
| 2007/0288827 A1 | 12/2007 | Song et al. |
| 2008/0098280 A1 | 4/2008 | Andersen |
| 2010/0180180 A1 | 7/2010 | Cideciyan et al. |
| 2015/0046767 A1 | 2/2015 | Cideciyan et al. |

OTHER PUBLICATIONS

Freitas, et al., "On the Iterative Decoding of Binary Product Codes Over the Binary Erasure Channel," 2011 8th International Symposium on Wireless Communication Systems (ISWCS), Nov. 2011, pp. 126-130.
Schwartz, et al., "On the Asymptotic Performance of Iterative Decoders for Product Codes," International Symposium on Information Theory, Sep. 2005, pp. 1758-1762.
International Search Report and Written Opinion from PCT Application No. PCT/CN2014/083149, dated Nov. 13, 2014.
Non-Final Office Action from U.S. Appl. No. 13/961,839, dated Jan. 28, 2015.
Notice of Allowance from U.S. Appl. No. 13/961,839, dated Jun. 10, 2015.
Cideciyan et al., U.S. Appl. No. 13/961,839, filed Aug. 7, 2013.
Examination Report from European Application No. GB1603366.4, dated Apr. 15, 2016.

* cited by examiner

COMBINATION ERROR AND ERASURE DECODING FOR PRODUCT CODES

BACKGROUND

The present invention relates to data storage, and more particularly, to providing improved product code decoding using combination error and erasure decoding.

Storage media and transmission media, such as magnetic tape, optical storage, or optical fiber transmission, use product codes to encode data, which then must be decoded to read the data from the medium. Product codes may also be used in storage-class and flash memories. The product code is a critical component of a two-level error correction architecture. Error correction in tape drives is typically based on product codes using a first-level C1 code and a second-level C2 code, a process which is well known in the art. Product codewords may be represented as two-dimensional arrays where rows of the array comprise codewords from a row code (C1 code) and columns of the array consist of codewords from a column code (C2 code).

Each data set is encoded using interleaved sets of codewords that are organized into an ECC-encoded matrix of size M bytes×N bytes (M×N) and then written to tape as shown in FIG. 1, according to the prior art. There are two levels of encoding within this matrix 150. The first level of encoding utilizes the matrix rows 102. Each row 102 of the matrix contains C1-ECC row parity 106, which adds p-bytes of C1-ECC to the n-bytes of user data (e.g., N=n+p bytes). The second level of encoding, C2-ECC column parity 108, adds q-bytes of C2-ECC to each matrix column 104. For example, if q=12, then adding 12 bytes of C2-ECC would add 12 rows to the matrix 150 (e.g., M=m+q bytes).

In tape storage, the decoder for the product code is designed to mitigate very long error events, such as drop-outs and sync slips. In some tape drives, the C1 decoder, which is also used during read-while-write, performs error decoding, and the C2 decoder performs erasure decoding. The drawback of this particular decoding strategy is that it does not perform well in the presence of short error events. Furthermore, this strategy does not allow for improved error rate performance using iterative decoding.

In other communication channels, such as optical fiber transmission channels, error decoding is used in the presence of very short independent bit errors. The drawback of this decoding strategy is that it works very well as long as long error events are negligible.

However, many of the channels and storage media, such as tape storage channels, exhibit both short and long error events. Therefore, there is a need for an improved decoding schedule/strategy, that delivers improved error rate performance in the presence of both long and short error events.

BRIEF SUMMARY

In one embodiment, a method for combination error and erasure decoding for product codes includes receiving, using a hardware processor, captured data. The method also includes generating, using the hardware processor, erasure flags for the captured data and providing the erasure flags to a C2 decoder. Moreover, the method includes setting a stop parameter to be equal to a length of C1 codewords in a codeword interleave used to encode the captured data. In addition, the method includes selectively performing, in an iterative process, error or erasure C1 decoding followed by error or erasure C2 decoding until decoding is successful or unsuccessful.

In another embodiment, a computer program product for combination error and erasure decoding for product codes includes a computer readable storage medium having program instructions embodied therewith. The program instructions are readable/executable by one or more processors to cause the one or more processors to receive captured data and generate, by the one or more processors, erasure flags for the captured data and provide the erasure flags to a C2 decoder. The program instructions are also readable/executable by the one or more processors to cause the one or more processors to set, by the one or more processors, a stop parameter to be equal to a length of C1 codewords in a codeword interleave used to encode the captured data. In addition, the program instructions are also readable/executable by the one or more processors to cause the one or more processors to selectively perform, by the one or more processors in an iterative process, error or erasure C1 decoding followed by error or erasure C2 decoding until decoding is successful or unsuccessful.

Other aspects and embodiments of the present invention will become apparent from the following detailed description, which, when taken in conjunction with the drawings, illustrates by way of example the principles of the invention.

DETAILED DESCRIPTION

Figure 1:
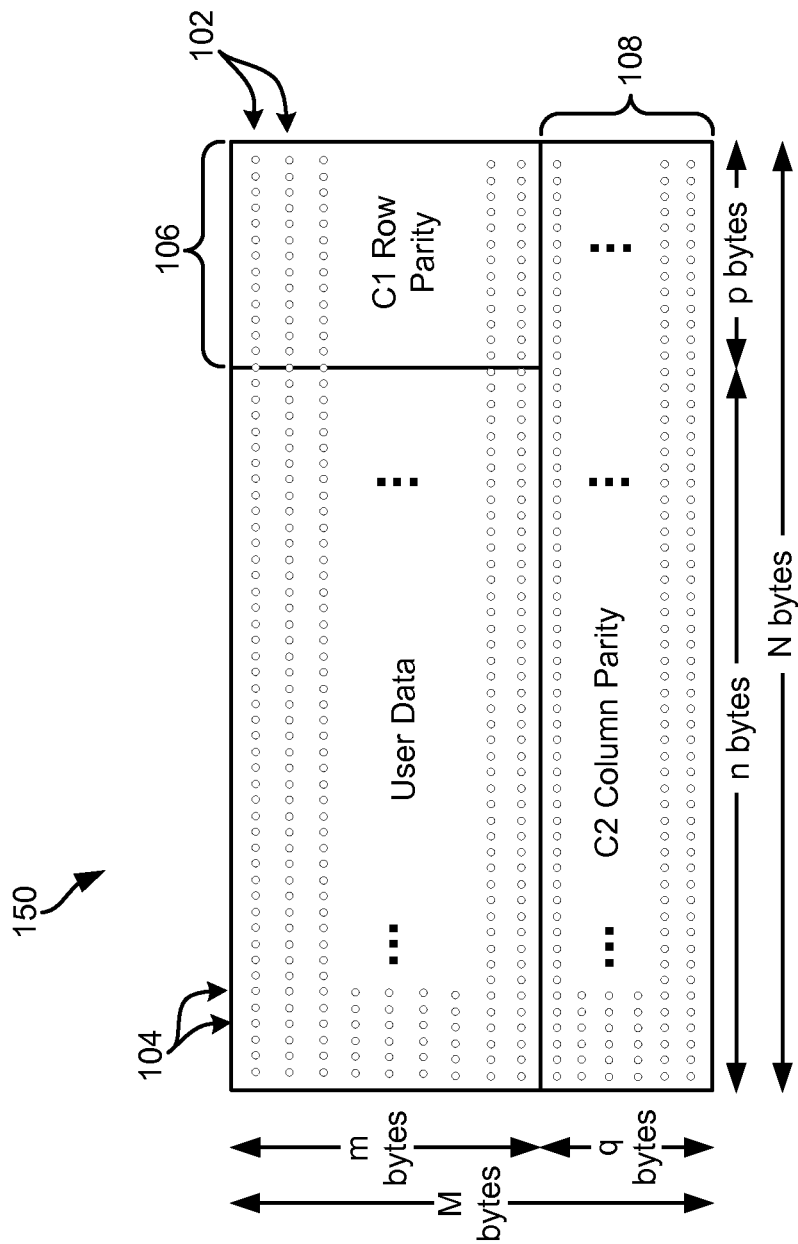
FIG. 1 shows a data set matrix or array, according to the prior art.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified.

According to one embodiment, a decoding strategy for product codes that is based on both error and erasure decoding is used in order to achieve improved error rate performance in the presence of short and long error events.

In one general embodiment, a system for combination error and erasure decoding for product codes includes a processor and logic integrated with and/or executable by the processor, the logic being configured to receive captured data, generate erasure flags for the captured data and provide the erasure flags to a C2 decoder, set a stop parameter to be equal to a length of C1 codewords in a codeword interleave used to encode the captured data, and selectively perform, in an iterative process, error or erasure C1 decoding followed by error or erasure C2 decoding until decoding is successful or unsuccessful.

In another general embodiment, a method for combination error and erasure decoding for product codes includes receiving captured data, generating erasure flags for the captured data and providing the erasure flags to a C2 decoder, setting a stop parameter to be equal to a length of C1 codewords in a codeword interleave used to encode the captured data, and selectively performing, in an iterative process, error or erasure C1 decoding followed by error or erasure C2 decoding until decoding is successful or unsuccessful.

According to another general embodiment, a computer program product for combination error and erasure decoding for product codes includes a computer readable storage medium having program code embodied therewith, the program code readable/executable by a processor to receive captured data, generate erasure flags for the captured data and provide the erasure flags to a C2 decoder, set a stop parameter to be equal to a length of C1 codewords in a codeword interleave used to encode the captured data, and selectively perform, in an iterative process, error or erasure C1 decoding followed by error or erasure C2 decoding until decoding is successful or unsuccessful.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as "logic," "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof, such as an electrical connection having one or more wires, an optical fiber, etc. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 2:
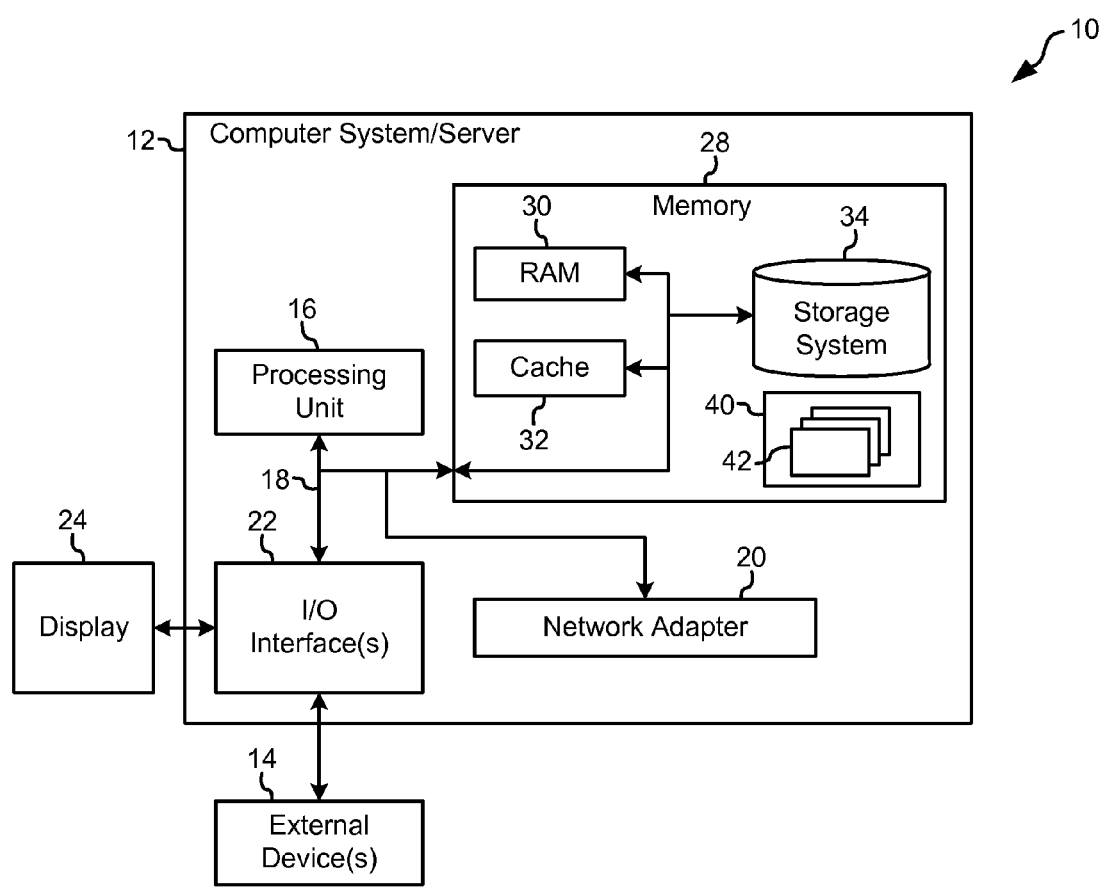
FIG. 2 illustrates a network storage system, according to one embodiment.

Referring now to FIG. 2, a schematic of a network storage system 10 is shown according to one embodiment. This network storage system 10 is only one example of a suitable storage system and is not intended to suggest any limitation as to the scope of use or functionality of embodiments of the invention described herein. Regardless, network storage system 10 is capable of being implemented and/or performing any of the functionality set forth hereinabove.

In the network storage system 10, there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 2, computer system/server 12 in the network storage system 10 is shown in the form of a general-purpose computing device. In one embodiment, the computer system 12 may be used in conjunction with a tape drive system. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 may include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 may be provided for reading from and writing to a non-removable, non-volatile magnetic media—not shown and typically called a "hard disk," which may be operated in a HDD. Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media may be provided. In such instances, each may be connected to bus 18 by one or more data media interfaces. As will be further depicted and described below, memory 28 may include at least one program product having a set (e.g., at least one) of program modules that are configured to carry out the functions of embodiments described herein.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication may occur via Input/Output (I/O) interfaces 22. Still yet, computer system/server 12 may communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 3:
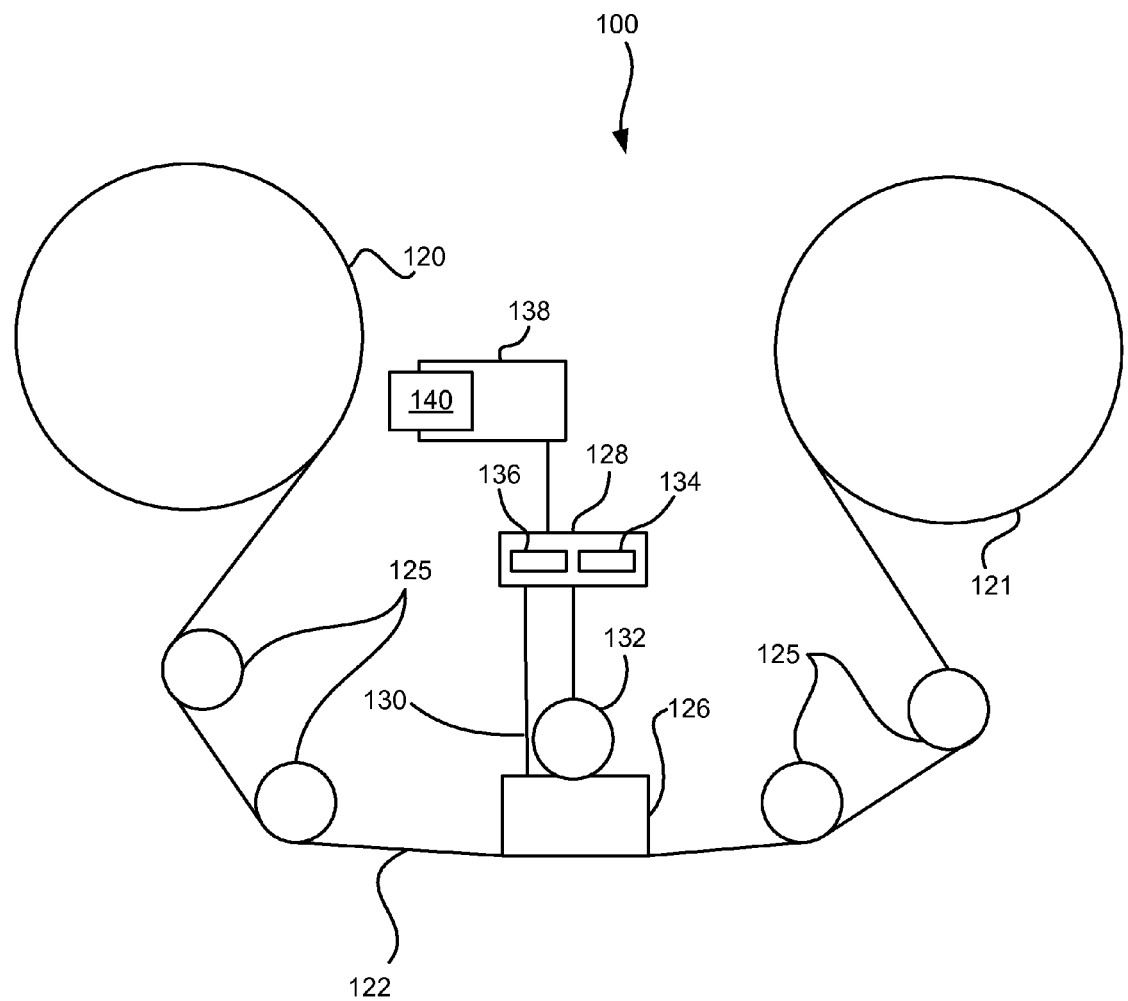
FIG. 3 illustrates a simplified tape drive of a tape-based data storage system, according to one embodiment.

FIG. 3 illustrates a simplified tape drive 100 of a tape-based data storage system, which may be employed according to various embodiments. While one specific implementation of a tape drive is shown in FIG. 3, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the tape drive 100. The tape drive 100, such as that illustrated in FIG. 3, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically comprises a servo channel 134 and data channel 136 which includes data flow processing. It controls reel motion (not shown in FIG. 3) and head functions, such as track following, writing, reading, etc. The cable 130 may include read/write circuits to transmit data to the head 126 to be recorded on the tape 122 and to receive data read by the head 126 from the tape 122. An actuator 132 moves the head 126 to a set of tracks on the tape 122 in order to perform a write or a read operation.

In one embodiment, the tape drive 100 may comprise a data buffer 138 which is accessible by the tape drive 100 and the controller 128. This data buffer 138 may be organized as a ring buffer and may be split into one or more portions, with one portion being a reserved data buffer 140, which may also be organized into a ring buffer, to be used for storage of partial data sets during reading operations from the tape 122.

An interface may also be provided for communication between the tape drive 100 and a host (integral or external) to send and receive the data and for controlling the operation of the tape drive 100 and communicating the status of the tape drive 100 to the host, as would be understood by one of skill in the art.

According to one embodiment, a decoding strategy for product codes that is based on both error and erasure decoding is used in order to achieve better error rate performance than conventional techniques when encountering both short and long error events, as are commonly experienced in actual tape decoding. Innovative aspects of this decoding strategy include: conditional branching to perform error or erasure decoding, a stopping mechanism based on a parameter (referred to herein as E2) which is introduced to guarantee that an iterative decoding algorithm for decoding product codes will stop after a fixed number of iterations, and initial erasure flagging for C2 decoding before decoding of the product code begins.

One conventional approach to stop the decoding algorithm is to allow a predetermined or fixed number of iterations to occur, and then to stop decoding. However, this approach may be used in unison with the use of parameter E2, thereby providing even better performance and limiting decoding latency.

According to various embodiments, techniques described herein may be used in a non-iterative decoding mode (single iteration) where C1 decoding is followed by C2 decoding, or in an iterative-decoding mode where several iterations of C1/C2 decoding are performed. These techniques may also be used on-the-fly or during an error recovery procedure (ERP). Many benefits may be achieved by using the techniques described herein, including improved error rate performance in the presence of short and long error events, being able to use a certified legacy C2 erasure decoding scheme as an initial decoding step, and being able to perform iterative and non-iterative decoding.

For exemplary purposes, the following parameters were used in decoding testing. For the C1 code, a Reed-Solomon (RS) code was used having the following parameters: RS(N1=240, K1=230, d1=11). For the C2 code, the parameters were RS(N2=96, K2=84, d2=13), where N1 and N2 are the block length which is equal to the number of bytes in each codeword in the array, K1 and K2 are the message length which equals the number of data bytes in each codeword, and d1 and d2 are the distance or minimum distance which equals N−K+1, where d−1 erasures may be corrected by the RS code.

According to a first exemplary decoding strategy (Strategy A), non-iterative decoding may be performed with erasure pointers. Since the number of errors that may be corrected by the C1-decoder, t1, is determined based on a relationship where t1=(d1−1)/2=(11−1)/2=5, an amount of correctable errors may be determined for the C1-decoder as t1=5. For the sake of this example, it is assumed that in Strategy A, the C1-decoder may correct up to 4 errors (t1=5−1 to include a margin of 1 to reduce miscorrections) and uncorrectable rows are marked as erasures for the C2-decoder. The C2-decoder then operates in erasure mode correcting up to d2−1=12 erasures with no additional margin included. For an odd minimum distance d2, the maximum erasure correcting capability is related to the maximum error correction capability by d2−1 =2×t2.

In another exemplary decoding strategy (Strategy B), iterative decoding may be used, with the C1- and C2-decoders operating as in Strategy A. If successful, the decoding strategy terminates after C1-decoding; otherwise, the C2-decoder is informed about which rows have been corrected and which rows have C1 decoding failures therein. The C2-decoder then performs error decoding on the erroneous sub-array and applies a second pass of C1/C2 decoding.

In order to select the error and erasure decoding parameters in the C2-decoder for Strategy B, rows with known long defects, such as sync slips, or missing data because of missing headers are flagged as erasures for the C2-decoder.

Now, assuming operation of Strategy A and B as described above, for long error bursts, e.g., cycle slips, in a worst case scenario, of very long error events along the C1 codewords, the C1 failure rate is a good measure for the byte error rate at the C2-decoder input. In this case, erasure decoding alone is substantially better than error decoding alone. In another scenario where random errors are encountered along the C1 codewords, the C1 failure rate is a very pessimistic measure for the byte error rate at the C2-decoder input, and error decoding alone is substantially better than erasure decoding alone. An analysis of captured data produced from Strategy A and B, which had failed in C2 erasure decoding, showed that C2 error decoding was able to correct the errors in these cases.

However, in real-world applications, errors in captured data are neither always long error bursts nor random errors. Regardless of which types of errors are encountered, two-pass iterative decoding (a specific implementation of Strategy B) is capable of handling a C1 error rate that is approximately 100 times higher than the C1 error rate that may be handled by Strategy A. Furthermore, when Strategy B utilizes two fully erroneous (erased) rows, the error-only mode of Strategy B is capable of handling 15 times larger C1-failure rates than Strategy A. Moreover, when Strategy B utilizes two fully erroneous (erased) rows in error/erasure mode, 50 times larger C1-failure rates may be handled than compared to Strategy A.

This all leads to a decision that error and erasure decoding, whether in a non-iterative or an iterative strategy, will provide better error rate performance than conventional methods.

Figure 4:
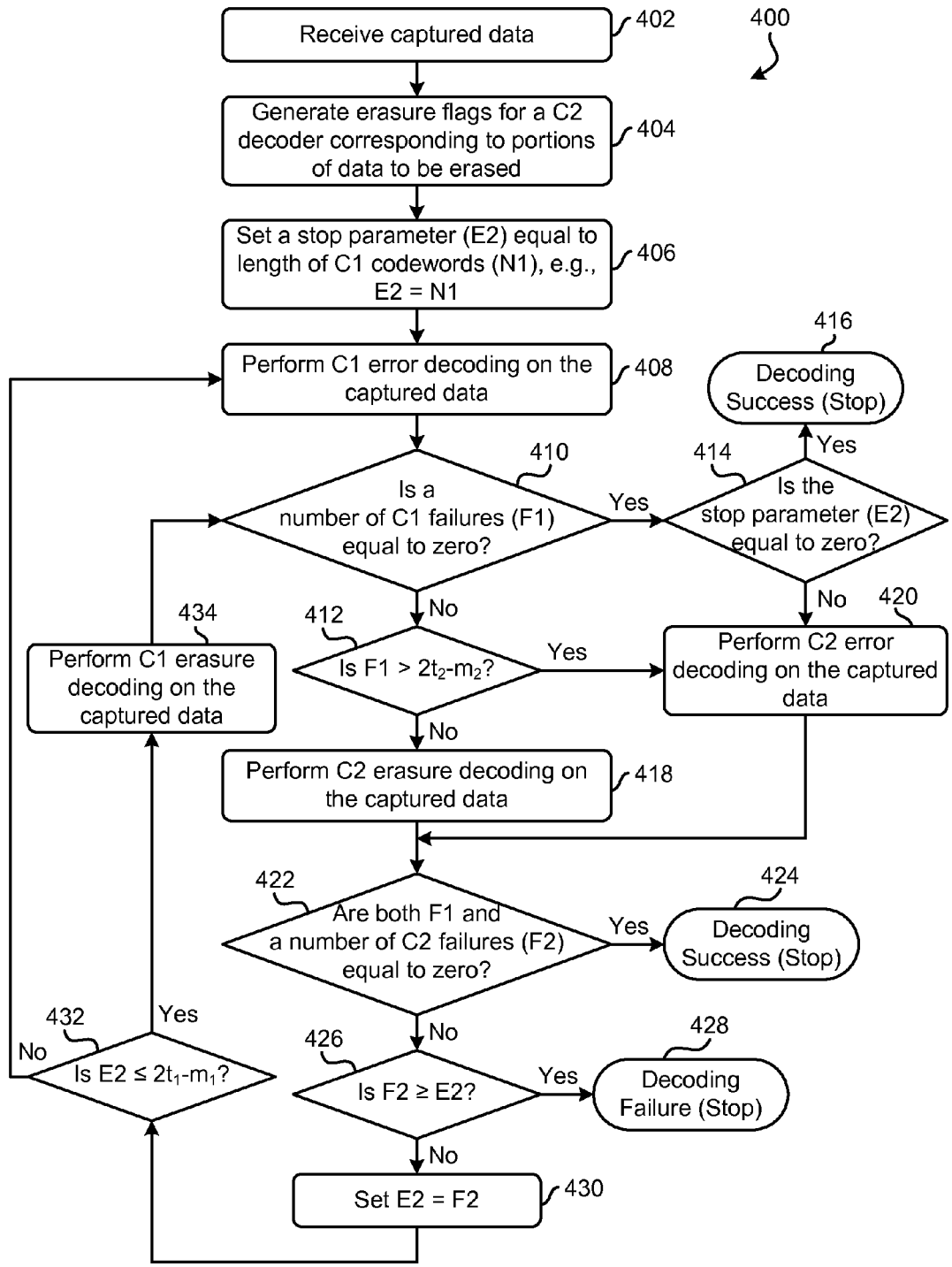
FIG. 4 is a flowchart of a method according to one embodiment.

Now referring to FIG. 4, a flowchart of a method 400 for combination error-and-erasure decoding for product codes is shown according to one embodiment. The method 400 may be performed in accordance with the present invention in any of the environments depicted in FIGS. 1-3, among others, in various embodiments. Of course, more or less operations than those specifically described in FIG. 4 may be included in method 400, as would be understood by one of skill in the art upon reading the present descriptions. In one approach, the method 400 may be used to decode data from a tape medium, which may be any suitable magnetic data storage tape known in the art.

Each of the steps of the method 400 may be performed by any suitable component of the operating environment. For example, in various non-limiting embodiments, the method 400 may be partially or entirely performed by a tape drive, an optical drive, a processor, such as a central processing unit (CPU), an application specific integrated circuit (ASIC), a field programmable gate array (FPGA), etc., which may be embedded in and/or operate within a system, an apparatus, a drive, a storage device, etc., and which may have logic embedded with and/or accessible to the processor.

As shown in FIG. 4, method 400 may initiate with operation 402, where captured data is received. The data may be captured from any suitable storage medium, such as a magnetic tape, an optical drive, an optical communication fiber, etc. Captured data is data which is received through one or more data channels which has previously been encoded with a product code (C1/C2) for storage and/or transmission thereof.

In operation 404, erasure flags, which indicate rows with unreliable and/or missing data, are generated for the captured data and provided to a C2 decoder. Each erasure flag corresponds to a portion of the captured data which is to be treated as erased during C2 erasure decoding (as opposed to being left alone for error decoding) due to an observed, calculated, or anticipated condition which will be better recovered using erasure decoding, such as an error burst condition (long burst of errors).

According to one embodiment, erasure flags may be generated based on any of the following conditions which are indicative of a long error burst: a header for a codeword interleave (such as a CWI-4 that includes four interleaved codewords) is not detected or missing, a phase-locked loop (PLL) cycle slip is detected, a number of detected contiguous illegal modulation codewords within a CWI-4 (or C1 codeword) at an output of the modulation decoder exceeds a predetermined threshold amount (such as ten 17-bit modulation codewords), a number of bits between a Forward Sync pattern (such as a predetermined 17-bit pattern) and a Re-Sync pattern (such as a predetermined 33-bit pattern) does not equal a size of a header and four codeword interleaves (e.g., 7776 bits), and/or a number of bits between a Re-Sync pattern and a Reverse Sync pattern does not equal a size of a header and four codeword interleaves (e.g., 7776 bits).

According to various embodiments, a PLL cycle slip may be detected according to any technique known in art, for instance, by applying the method in U.S. Pat. No. 7,003,065. Also, the threshold amount may be any suitable number that depends on the correction capability of the C1 code, the interleaving factor, and the length of the modulation codewords. For instance, for the considered CWI-4s and a length-17 modulation code, 10 contiguous illegal modulation codewords are indicative of a long error event that cannot be corrected by the C1 code. Furthermore, any technique known in the art may be used to try to detect a CWI-4 header. The 7776 bits is calculated based on counting the number of bits between two sync patterns, which amounts to 12 Bytes for the header plus 4×240 Bytes for the CWI-4, that is 7776 bits. For other layouts having different sized headers and/or codeword interleaves, this 7776 bits may be adjusted to reflect the other data format.

In operation 406, a stop parameter (E2) is set to be equal to a length of C1 codewords (N1) in the CWI-4, e.g., E2=N1.

The stop parameter may then be used for determining when to stop the method 400 (either due to decoding being successful or unsuccessful).

In operation 408, C1 error decoding is performed on the captured data. According to one embodiment C1 error decoding includes error-and-erasure decoding where the rows with the read-back C1 codewords are kept unchanged (not erased or otherwise altered, even though it is indicated that the decision is incorrect by an erasure flag generated in 404 or 420). Of course, in a first iteration (or in a non-iterative process), there are no C2 failures, and so this is moot.

In operation 410, it is determined whether a number of C1 failures (F1) detected after performing C1 (error or erasure) decoding on the captured data is equal to zero, e.g., F1=0. If so, method 400 continues to operation 414; otherwise, method 400 continues to operation 412.

In operation 412, it is determined whether the number of C1 failures (F1) is greater than two times a C2 error correction capability ($t_2$) minus a C2 decoding margin ($m_2$), e.g., $F1>2t_2-m_2$. If so, method 400 continues to operation 420; otherwise, method 400 continues to operation 418. The C2 decoding margin may be the same or different depending on whether the margin is being used for error or erasure decoding.

The C2 error correction capability ($t_2$) represents a number of C2 errors which are correctable using the product codes in the particular captured data, and may be an integer having a value greater than zero, such as 1, 2, 4, 6, 7, 10, etc., depending on the parameters of the selected RS code for C2. The C2 decoding margin ($m_2$) is a value which may be automatically set or selected by an administrator or other user which provides a margin between the C2 error correction capability ($t_2$) and a "safer" approximation of how many errors the C2 decoder is capable of correcting. In one embodiment, the margin may be associated only with C2 erasure decoding, or with C2 error-and-erasure decoding.

In operation 414, it is determined whether the stop parameter (E2) is greater is equal to zero, e.g., E2=0. If so, method 400 continues to operation 416 and stops because the decoding has been successful, e.g., there are no more detected errors in the decoded data; otherwise, method 400 continues to operation 420.

In operation 418, C2 erasure decoding is performed on the captured data (either after having C1 decoding performed thereon or in native captured form without having any C1 decoding thereof). According to one embodiment C2 erasure decoding includes error-and-erasure decoding where C1 failures are erased. When C2 erasure decoding is performed after C1 decoding, even in a first iteration (or in a non-iterative process), C1 failures (unless none are detected) will exist and will be treated as erased data.

In operation 420, C2 error decoding is performed on the captured data (either after having C1 decoding performed thereon or in native captured form without having any C1 decoding thereof). According to one embodiment C2 error decoding includes error-and-erasure decoding where C1 failures are kept unchanged (not erased or otherwise altered, even though it is indicated that the decision is incorrect). When C2 decoding is performed after C1 decoding, even in a first iteration (or in a non-iterative process), C1 failures (unless none are detected) will exist. The decoder generates erasure flags for those columns on which a C2 decoding failure occurs.

In operation 422, it is determined whether both the number of C1 failures (F1) and a number of C2 failures (F2) are equal to zero, e.g., F1=0 ∧ F2=0. If so, method 400 continues to operation 424 and stops because the decoding has been successful, e.g., there are no more detected errors in the decoded data; otherwise, method 400 continues to operation 426.

In operation 426, it is determined whether the number of C2 failures (F2) is greater than or equal to the stop parameter (E2), e.g., F2≥E2. If so, method 400 continues to operation 428 and stops because decoding has been unsuccessful and the errors are unrecoverable/uncorrectable; otherwise, method 400 continues to operation 430 where the stop parameter (E2) is set to the number of C2 failures (F2). In this way, it is ensured that iterations will only converge toward less C2 errors, not diverge and cause more C2 errors and/or become stuck in a looping situation that does not ever resolve itself.

In operation 432, it is determined whether the stop parameter (E2) is less than or equal to two times a C1 error correction capability ($t_1$) minus a C1 decoding margin ($m_1$), e.g., $E2 \leq 2t_1 - m_1$. The C1 decoding margin may be the same or different depending on whether the margin is being used for error or erasure decoding.

If so, method 400 continues to operation 434 where C1 erasure decoding is performed on the captured data using the erasure flags from operation 420; otherwise, method 400 continues to operation 408 to perform C1 error decoding again. In one embodiment, C1 erasure decoding includes error-and-erasure decoding where C2 failures are treated as erased data. In method 400 when C2 decoding is performed after initial C1 decoding, even in a first iteration (or in a non-iterative process), C2 failures (unless none are detected) will exist and will be treated as erased data.

The C1 error correction capability ($t_1$) represents a number of C1 errors which are correctable using the product codes in the particular captured data, and may be an integer having a value greater than zero, such as 1, 2, 5, 6, 7, 10, etc., depending on the parameters of the selected RS code for C1. The C1 decoding margin ($m_1$) is a value which may be automatically set or selected by an administrator or other user which provides a margin between the C1 error correction capability ($t_1$) and a "safer" approximation of how many errors the C1 decoder is capable of correcting. In one embodiment, the margin may be associated only with C1 erasure decoding, or with C1 error-and-erasure decoding.

Method 400 continues until one of the stopping points in operations 416, 424, and/or 428 are arrived at. The stop parameter E2 is designed to ensure that method 400 will not be ensnared in an endless loop, and will definitely arrive at one of the stopping points in operations 416, 424, and/or 428 within a finite number of iterations.

According to one embodiment, the method 400 may be performed by a system. For example, the system may be configured for combination error-and-erasure decoding for product codes, and the system may comprise a processor (such as a CPU, ASIC, FPGA, IC, etc.) and logic integrated with and/or executable by the processor. The logic may be hardware, software, or some combination thereof, and may be configured to execute one or more operations of method 400, and may be configured to perform additional functions not specifically described herein, in various approaches.

In another embodiment, a computer program product may be designed for combination error-and-erasure decoding for product codes, the computer program product comprising a computer readable storage medium having program code embodied therewith. In one embodiment, the program code may be readable and/or executable by a device, such as a tape drive, processor, etc., to execute one or more operations of method 400, and may be configured to perform additional functions not specifically described herein, in various approaches.

Figure 5:
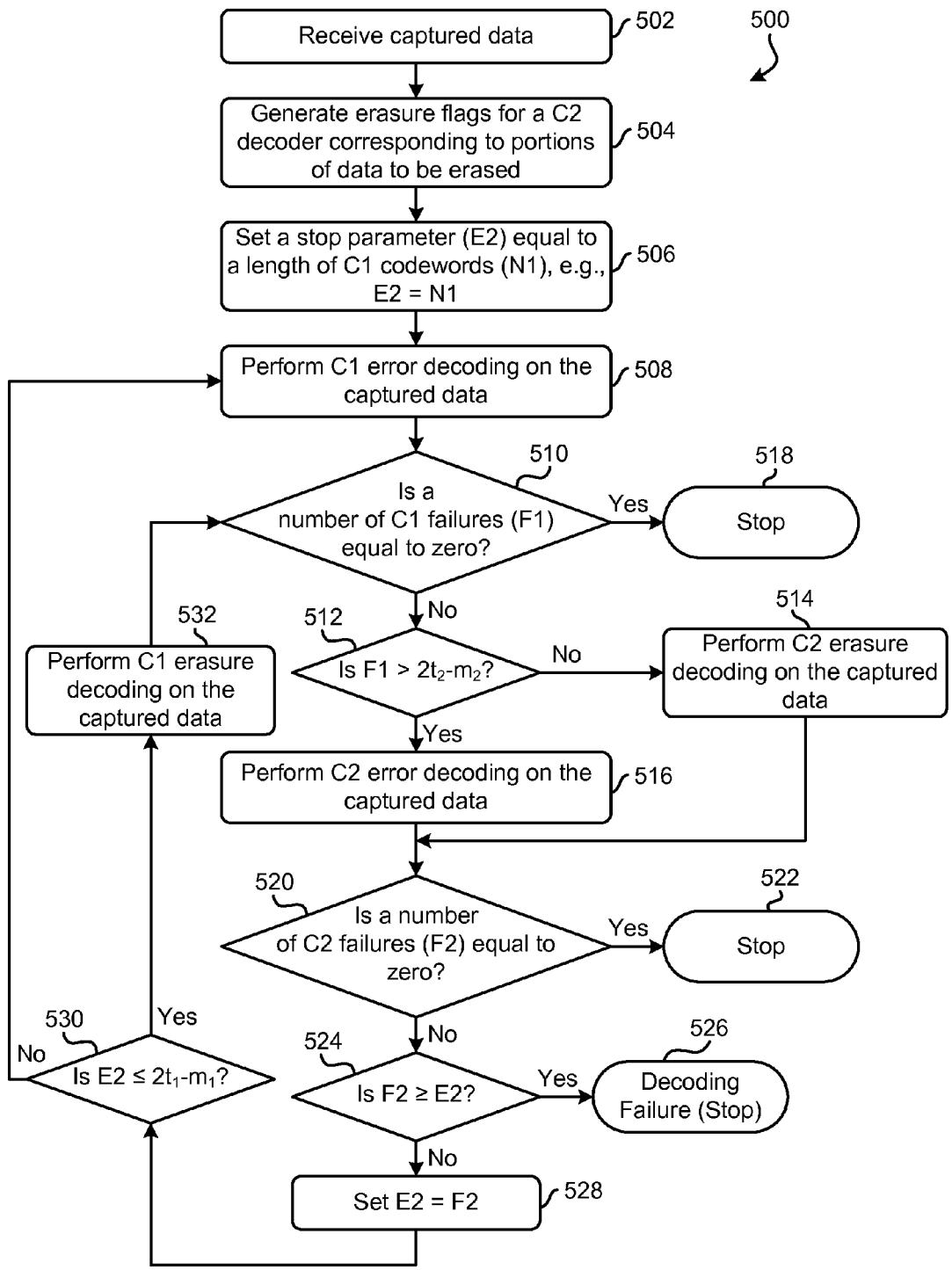
FIG. 5 is a flowchart of a method according to another embodiment.

Now referring to FIG. 5, a flowchart of a method 500 for combination error-and-erasure decoding for product codes is shown according to one embodiment. The method 500 may be performed in accordance with the present invention in any of the environments depicted in FIGS. 1-3, among others, in various embodiments. Of course, more or less operations than those specifically described in FIG. 5 may be included in method 500, as would be understood by one of skill in the art upon reading the present descriptions. In one approach, the method 500 may be used to decode data from a tape medium, which may be any suitable magnetic data storage tape known in the art.

Each of the steps of the method 500 may be performed by any suitable component of the operating environment. For example, in various non-limiting embodiments, the method 500 may be partially or entirely performed by a tape drive, an optical drive, a processor, such as a CPU, an ASIC, a FPGA, etc., which may be embedded in and/or operate within a system, an apparatus, a drive, a storage device, etc., and which may have logic embedded with and/or accessible to the processor.

As shown in FIG. 5, method 500 may initiate with operation 502, where captured data is received. The data may be captured from any suitable storage medium, such as a magnetic tape, an optical drive, an optical communication fiber, etc. Captured data is data which is received through one or more data channels which has previously been encoded with a product code (C1/C2) for storage and/or transmission thereof.

In operation 504, erasure flags, which indicate rows with unreliable and/or missing data, are generated for the captured data and provided to a C2 decoder. Each erasure flag corresponds to a portion of the captured data which is to be treated as erased during erasure decoding (as opposed to being left alone for error decoding) due to an observed or anticipated condition which will be better recovered using erasure decoding, such as an error burst condition (long burst of errors).

According to one embodiment, erasure flags may be generated based on any of the following conditions which are indicative of a long error burst: a header for a codeword interleave (such as a CWI-4 that includes four interleaved codewords) is not detected or missing, a PLL cycle slip is detected, a number of detected contiguous illegal modulation codewords within a CWI-4 (or C1 codeword) at an output of the modulation decoder exceeds a predetermined threshold amount, a number of bits between a Forward Sync pattern and a Re-Sync pattern does not equal a size of a header and four codeword interleaves (e.g., 7776 bits), and/or a number of bits between a Re-Sync pattern and a Reverse Sync pattern does not equal a size of a header and four codeword interleaves (e.g., 7776 bits).

According to various embodiments, a PLL cycle slip may be detected according to any technique known in art. Furthermore, any technique known in the art may be used to try to detect a CWI-4 header. The 7776 bits is calculated based on counting the number of bits between two sync patterns, which amounts to 12 Bytes for the header plus 4×240 Bytes for the CWI-4, that is 7776 bits. For other layouts having different sized headers and/or codeword interleaves, this 7776 bits may be adjusted to reflect the other data format.

In operation 506, a stop parameter (E2) is set to be equal to a length of C1 codewords (N1) in the CWI-4, e.g., E2=N1.

The stop parameter may then be used for determining when to stop the method 500 (either due to decoding being successful or unsuccessful).

In operation 508, C1 error decoding is performed on the captured data. According to one embodiment C1 error decoding includes error-and-erasure decoding where the rows with the read-back C1 codewords are kept unchanged (not erased or otherwise altered, even though it is indicated that the decision is incorrect by an erasure flag).

In operation 510, it is determined whether a number of C1 failures (F1) detected after performing C1 (error or erasure) decoding on the captured data is equal to zero, e.g., F1=0. If so, method 500 continues to operation 518; otherwise, method 500 continues to operation 512.

In operation 512, it is determined whether the number of C1 failures (F1) is greater than two times a C2 error correction capability ($t_2$) minus a C2 decoding margin ($m_2$), e.g., $F1>2t_2-m_2$. If so, method 500 continues to operation 516; otherwise, method 500 continues to operation 514.

The C2 error correction capability ($t_2$) represents a number of C2 errors which are correctable using the product codes in the particular captured data, and may be an integer having a value greater than zero, such as 1, 2, 5, 6, 7, 10, etc., depending on the parameters of the selected RS code for C2. The C2 decoding margin ($m_2$) is a value which may be automatically set or selected by an administrator or other user which provides a margin between the C2 error correction capability ($t_2$) and a "safer" approximation of how many errors the C2 decoder is capable of correcting. In one embodiment, the margin may be associated only with C2 erasure decoding, or with C2 error-and-erasure decoding.

In operation 514, C2 erasure decoding is performed on the captured data (either after having C1 decoding performed thereon or in native captured form without having any C1 decoding thereof). According to one embodiment C2 erasure decoding includes error-and-erasure decoding where C1 failures are erased. When C2 erasure decoding is performed after C1 decoding, even in a first iteration (or in a non-iterative process), C1 failures (unless none are detected) will exist and will be treated as erased data.

In operation 516, C2 error decoding is performed on the captured data (either after having C1 decoding performed thereon or in native captured form without having any C1 decoding thereof). According to one embodiment C2 error decoding includes error-and-erasure decoding where C1 failures are kept unchanged (not erased or otherwise altered, even though it is indicated that the decision is incorrect). When C2 decoding is performed after C1 decoding, even in a first iteration (or in a non-iterative process), C1 failures (unless none are detected) will exist. The decoder generates erasure flags for those columns on which a C2 decoding failure occurs.

In operation 520, it is determined whether a number of C2 failures (F2) is equal to zero, e.g., F2=0. If so, method 500 continues to operation 522 and stops because the decoding has been successful, e.g., there are no more detected errors in the decoded data; otherwise, method 500 continues to operation 524.

In operation 524, it is determined whether the number of C2 failures (F2) is greater than or equal to the stop parameter (E2), e.g., $F2 \geq E2$. If so, method 500 continues to operation 526 and stops because decoding has been unsuccessful and the errors are unrecoverable/uncorrectable; otherwise, method 500 continues to operation 528 where the stop parameter (E2) is set to the number of C2 failures (F2). In this way, it is ensured that iterations will only converge toward less C2 errors, not diverge and cause more C2 errors and/or become stuck in a looping situation that does not ever resolve itself.

In operation 530, it is determined whether the stop parameter (E2) is less than or equal to two times a C1 error correction capability ($t_1$) minus a C1 decoding margin ($m_1$), e.g., $E2 \leq 2t_1-m_1$. If so, method 500 continues to operation 532 where C1 erasure decoding is performed on the captured data using the erasure flags from operation 516; otherwise, method 500 continues to operation 508 to perform C1 error decoding again. In one embodiment, C1 erasure decoding includes error-and-erasure decoding where C2 failures are erased. In method 500 when C2 decoding is performed after initial C1 decoding, even in a first iteration (or in a non-iterative process), C2 failures (unless none are detected) will exist and will be treated as erased data.

The C1 error correction capability ($t_1$) represents a number of C1 errors which are correctable using the product codes in the particular captured data, and may be an integer having a value greater than zero, such as 1, 2, 5, 6, 7, 10, etc., depending on the parameters of the selected RS code for C1. The C1 decoding margin ($m_1$) is a value which may be automatically set or selected by an administrator or other user which provides a margin between the C1 error correction capability ($t_1$) and a "safer" approximation of how many errors the C1 decoder is capable of correcting. In one embodiment, the margin may be associated only with C1 erasure decoding, or with C1 error-and-erasure decoding.

Method 500 continues until one of the stopping points in operations 518, 522, and/or 526 are arrived at. The stop parameter E2 is designed to ensure that method 500 will not be ensnared in an endless loop, and will definitely arrive at one of the stopping points in operations 518, 522, and/or 526 within a finite number of iterations.

When the decoding method 500 stops at one of the stopping points in operations 518, 522, and/or 526, according to one embodiment, it may be determined whether all rows and columns of the decoded data (product codeword) are legal C1 codewords (rows) and legal C2 codewords (columns). When a product codeword is legal (allowed), the decoding is successful; otherwise the decoding is unsuccessful (decoding failure).

According to one embodiment, the method 500 may be performed by a system. For example, the system may be configured for combination error-and-erasure decoding for product codes, and the system may comprise a processor (such as a CPU, ASIC, FPGA, IC, etc.) and logic integrated with and/or executable by the processor. The logic may be hardware, software, or some combination thereof, and may be configured to execute one or more operations of method 500, and may be configured to perform additional functions not specifically described herein, in various approaches.

In another embodiment, a computer program product may be designed for combination error-and-erasure decoding for product codes, the computer program product comprising a computer readable storage medium having program code embodied therewith. In one embodiment, the program code may be readable and/or executable by a device, such as a tape drive, processor, etc., to execute one or more operations of method 500, and may be configured to perform additional functions not specifically described herein, in various approaches.

Iterative decoding of product codes is known in the art, but it has not been performed using a specific erasure-and-error decoding schedule. For example, U.S. Pat. No. 8,046,660 describes a product code decoder for nonvolatile memory. The decoder decodes first- and second-dimension codewords. When a first decoder detects an error in one of the first-dimension codewords, that first-dimension codeword is marked as an erasure. A second decoder detects another error in one of the second-dimension codewords based on the erasure. The first and second decoders iteratively decode the codewords to determine other errors in the first- and second-dimension codewords.

However, U.S. Pat. No. 8,046,660 does not disclose a specific decoding schedule, but instead is limited to standard iterative error-and-erasure decoding of product codes. In particular, it does not teach decoding schedules using error-and-erasure decoding, which are guaranteed to complete within a finite number of iterations. Moreover, U.S. Pat. No. 8,046,660 does not consider initial erasure flagging for the C2 decoder, which is based on channel side-information.

Figure 6:
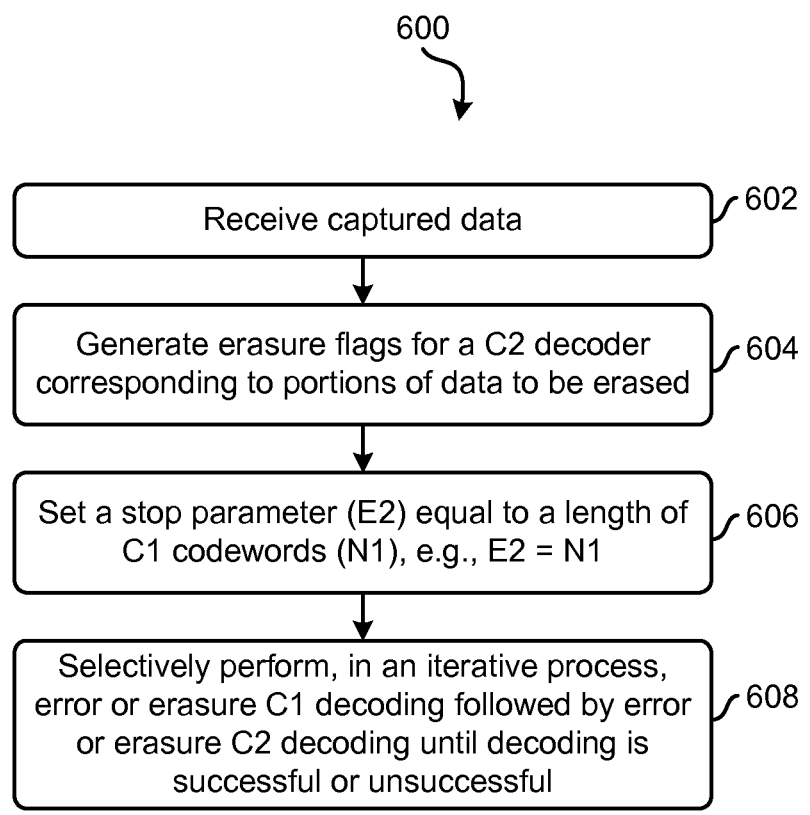
FIG. 6 is a flowchart of a method according to yet another embodiment.

Now referring to FIG. 6, a flowchart of a method 600 for combination error-and-erasure decoding for product codes is shown according to one embodiment. The method 600 may be performed in accordance with the present invention in any of the environments depicted in FIGS. 1-3, among others, in various embodiments. Of course, more or less operations than those specifically described in FIG. 6 may be included in method 600, as would be understood by one of skill in the art upon reading the present descriptions. In one approach, the method 600 may be used to decode data from a tape medium, which may be any suitable magnetic data storage tape known in the art.

Each of the steps of the method 600 may be performed by any suitable component of the operating environment. For example, in various non-limiting embodiments, the method 600 may be partially or entirely performed by a tape drive, an optical drive, a processor, such as a CPU, an ASIC, an FPGA, etc., which may be embedded in and/or operate within a system, an apparatus, a drive, a storage device, etc., and which may have logic embedded with and/or accessible to the processor.

As shown in FIG. 6, method 600 may initiate with operation 602, where captured data is received. Then, in operation 604, erasure flags for the captured data are generated and provided to a C2 decoder. Next, in operation 606, a stop parameter is set to be equal to a length of C1 codewords in a codeword interleave used to encode the captured data. Finally, in operation 608, in an iterative process, error or erasure C1 decoding followed by error or erasure C2 decoding are selectively performed until decoding is successful or unsuccessful.

According to one embodiment, each erasure flag may correspond to a portion of the captured data which is to be treated as erased during erasure decoding due to an observed or calculated condition. These observed or calculated conditions may include any conditions that may be capable of indicating that a burst of errors has occurred in the captured data. According to various embodiments, the observed or calculated condition may include at least one of: a header for a codeword interleave not being detected, detection of a PLL cycle slip, a number of detected contiguous illegal modulation codewords within a codeword interleave or C1 codeword at an output of a modulation decoder exceeding a predetermined threshold amount, a number of bits between a Forward Sync pattern and a Re-Sync pattern not being equal to a size of a header and four codeword interleaves, and/a number of bits between a Re-Sync pattern and a Reverse Sync pattern not being equal to a size of a header and four codeword interleaves.

According to another embodiment, the iterative process may comprise: performing C1 error decoding on the captured data in a first iteration and when the stop parameter is less than or equal to two times a C1 error correction capability minus a C1 decoding margin, otherwise performing C1 erasure decoding on the captured data; determining that decoding is successful when a number of C1 failures is equal to zero and the stop parameter equals zero after performing C1 decoding; performing C2 error decoding on the captured data after performing C1 decoding when the number of C1 failures is greater than two times a C2 error correction capability minus a C2 decoding margin; performing C2 erasure decoding on the captured data after performing C1 decoding when the stop parameter does not equal zero or the number of C1 failures is less than or equal to two times the C2 error correction capability minus the C2 decoding margin and greater than zero; determining that decoding is successful after performing C2 decoding when both a number of C2 failures and a number of C1 failures are equal to zero; and determining that decoding is unsuccessful after performing C2 decoding when a number of C2 failures is greater than or equal to the stop parameter, otherwise setting the stop parameter equal to the number of C2 failures.

In another embodiment, the iterative process may comprise: performing C1 error decoding on the captured data in a first iteration and when the stop parameter is less than or equal to two times a C1 error correction capability minus a C1 decoding margin, otherwise performing C1 erasure decoding on the captured data; stopping decoding when a number of C1 failures is equal to zero and perform codeword check; performing C2 error decoding on the captured data after performing C1 decoding when the number of C1 failures is greater than two times a C2 error correction capability minus a C2 decoding margin, otherwise performing C2 erasure decoding on the captured data after performing C1 decoding; stopping decoding after performing C2 decoding when a number of C2 failures is equal to zero; and determining that decoding is unsuccessful after performing C2 decoding when a number of C2 failures is greater than or equal to the stop parameter, otherwise setting the stop parameter equal to the number of C2 failures. The codeword check may comprise determining that every C1 codeword is legal and every C2 codeword is legal, such that decoding is successful when every C1 codeword is legal and every C2 codeword is legal, otherwise decoding is unsuccessful.

In a further embodiment, the C1 error correction capability may represent a number of C1 errors which are correctable using product codes in the captured data, and the C2 error correction capability may represent a number of C2 errors which are correctable using product codes in the captured data.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A method for combination error and erasure decoding for product codes, the method comprising:
   receiving, using a hardware processor, captured data;
   generating, using the hardware processor, erasure flags for the captured data and providing the erasure flags to a C2 decoder;
   setting a stop parameter to be equal to a length of C1 codewords in a codeword interleave used to encode the captured data; and
   selectively performing, in an iterative process, error or erasure C1 decoding followed by error or erasure C2 decoding until decoding is successful or unsuccessful.

2. The method as recited in claim 1, wherein each erasure flag corresponds to a portion of the captured data which is to be treated as erased during erasure decoding due to an observed or calculated condition.

3. The method as recited in claim 2, wherein the observed or calculated condition includes at least one observed or calculated condition selected from a group consisting of: a header for a codeword interleave not being detected, detection of a phase-locked loop (PLL) cycle slip, a number of detected contiguous illegal modulation codewords within a codeword interleave or C1 codeword at an output of a modulation decoder exceeding a predetermined threshold amount, a number of bits between a Forward Sync pattern and a Re-Sync pattern not being equal to a size of a header and four codeword interleaves, and/ a number of bits between a Re-Sync pattern and a Reverse Sync pattern not being equal to a size of a header and four codeword interleaves.

4. The method as recited in claim 1, wherein the selectively performing, in the iterative process, error or erasure C1 decoding followed by error or erasure C2 decoding until decoding is successful or unsuccessful comprises:
   performing C1 error decoding on the captured data in a first iteration in response to a determination that the stop parameter is less than or equal to two times a C1 error correction capability minus a C1 decoding margin, otherwise performing C1 erasure decoding on the captured data;
   determining that decoding is successful in response to a determination that a number of C1 failures is equal to zero and the stop parameter equals zero after performing C1 decoding;
   performing C2 error decoding on the captured data after performing C1 decoding in response to a determination that the number of C1 failures is greater than two times a C2 error correction capability minus a C2 decoding margin;
   performing C2 erasure decoding on the captured data after performing C1 decoding in response to a determination that the stop parameter does not equal zero or the number of C1 failures is less than or equal to two times the C2 error correction capability minus the C2 decoding margin and greater than zero;
   determining that decoding is successful after performing C2 decoding in response to a determination that both a number of C2 failures and a number of C1 failures are equal to zero; and
   determining that decoding is unsuccessful after performing C2 decoding in response to a determination that a number of C2 failures is greater than or equal to the stop parameter, otherwise setting the stop parameter equal to the number of C2 failures.

5. The method as recited in claim 4, wherein the C1 error correction capability represents a number of C1 errors which are correctable using product codes in the captured data, and wherein the C2 error correction capability represents a number of C2 errors which are correctable using product codes in the captured data.

6. The method as recited in claim 1, wherein the selectively performing, in the iterative process, error or erasure C1 decoding followed by error or erasure C2 decoding until decoding is successful or unsuccessful comprises:
   performing C1 error decoding on the captured data in a first iteration in response to a determination that the stop parameter is less than or equal to two times a C1 error correction capability minus a C1 decoding margin, otherwise performing C1 erasure decoding on the captured data;
   stopping decoding in response to a determination that a number of C1 failures is equal to zero and perform codeword check;
   performing C2 error decoding on the captured data after performing C1 decoding in response to a determination that the number of C1 failures is greater than two times a C2 error correction capability minus a C2 decoding margin, otherwise performing C2 erasure decoding on the captured data after performing C1 decoding;
   stopping decoding after performing C2 decoding in response to a determination that a number of C2 failures is equal to zero; and
   determining that decoding is unsuccessful after performing C2 decoding in response to a determination that a number of C2 failures is greater than or equal to the stop parameter, otherwise setting the stop parameter equal to the number of C2 failures,
   wherein the codeword check comprises determining that every C1 codeword is legal and every C2 codeword is legal, and wherein decoding is successful in response to a determination that every C1 codeword is legal and every C2 codeword is legal, otherwise decoding is unsuccessful.

7. The method as recited in claim 6, wherein the C1 error correction capability represents a number of C1 errors which are correctable using product codes in the captured data, and wherein the C2 error correction capability represents a number of C2 errors which are correctable using product codes in the captured data.

8. A computer program product for combination error and erasure decoding for product codes, the computer program product comprising a non-transitory computer readable storage medium having program instructions embodied therewith, the program instructions readable/executable by one or more processors to cause the one or more processors to:
   receive, by the one or more processors, captured data;
   generate, by the one or more processors, erasure flags for the captured data and provide the erasure flags to a C2 decoder;
   set, by the one or more processors, a stop parameter to be equal to a length of C1 codewords in a codeword interleave used to encode the captured data; and selectively perform, by the one or more processors in an iterative process, error or erasure C1 decoding followed by error or erasure C2 decoding until decoding is successful or unsuccessful.

9. The computer program product as recited in claim 8, wherein each erasure flag corresponds to a portion of the captured data which is to be treated as erased during erasure decoding due to an observed or calculated condition.

10. The computer program product as recited in claim 9, wherein the observed or calculated condition includes at least one observed or calculated condition selected from a group consisting of: a header for a codeword interleave not being detected, detection of a phase-locked loop (PLL) cycle slip, a number of detected contiguous illegal modulation codewords within a codeword interleave or C1 codeword at an output of a modulation decoder exceeding a predetermined threshold amount, a number of bits between a Forward Sync pattern and a Re-Sync pattern not being equal to a size of a header and four codeword interleaves, and/ a number of bits between a Re-Sync pattern and a Reverse Sync pattern not being equal to a size of a header and four codeword interleaves.

11. The computer program product as recited in claim 8, wherein the program instructions readable/executable by the one or more processors to selectively perform, by the one or more processors in the iterative process, error or erasure C1 decoding followed by error or erasure C2 decoding until decoding is successful or unsuccessful is readable/executable by the one or more processors to cause the one or more processors to:
  perform, by the one or more processors, C1 error decoding on the captured data in a first iteration in response to a determination that the stop parameter is less than or equal to two times a C1 error correction capability minus a C1 decoding margin, otherwise perform C1 erasure decoding on the captured data;
  determine, by the one or more processors, that decoding is successful in response to a determination that a number of C1 failures is equal to zero and the stop parameter equals zero after performing C1 decoding;
  perform, by the one or more processors, C2 error decoding on the captured data after performing C1 decoding in response to a determination that the number of C1 failures is greater than two times a C2 error correction capability minus a C2 decoding margin;
  perform, by the one or more processors, C2 erasure decoding on the captured data after performing C1 decoding in response to a determination that the stop parameter does not equal zero or the number of C1 failures is less than or equal to two times the C2 error correction capability minus the C2 decoding margin and greater than zero;
  determine, by the one or more processors, that decoding is successful after performing C2 decoding in response to a determination that both a number of C2 failures and a number of C1 failures are equal to zero; and
  determine, by the one or more processors, that decoding is unsuccessful after performing C2 decoding in response to a determination that a number of C2 failures is greater than or equal to the stop parameter, otherwise set the stop parameter equal to the number of C2 failures.

12. The computer program product as recited in claim 11, wherein the C1 error correction capability represents a number of C1 errors which are correctable using product codes in the captured data, and wherein the C2 error correction capability represents a number of C2 errors which are correctable using product codes in the captured data.

13. The computer program product as recited in claim 8, wherein the program instructions readable/executable by the one or more processors to selectively perform, by the one or more processors in the iterative process, error or erasure C1 decoding followed by error or erasure C2 decoding until decoding is successful or unsuccessful is readable/executable by the one or more processors to cause the one or more processors to:
  perform, by the one or more processors, C1 error decoding on the captured data in a first iteration in response to a determination that the stop parameter is less than or equal to two times a C1 error correction capability minus a C1 decoding margin, otherwise perform C1 erasure decoding on the captured data;
  stop, by the one or more processors, decoding in response to a determination that a number of C1 failures is equal to zero and perform a codeword check;
  perform, by the one or more processors, C2 error decoding on the captured data after performing C1 decoding in response to a determination that the number of C1 failures is greater than two times a C2 error correction capability minus a C2 decoding margin, otherwise perform C2 erasure decoding on the captured data after performing C1 decoding;
  stop, by the one or more processors, decoding after performing C2 decoding in response to a determination that a number of C2 failures is equal to zero; and
  determine, by the one or more processors, that decoding is unsuccessful after performing C2 decoding in response to a determination that a number of C2 failures is greater than or equal to the stop parameter, otherwise set the stop parameter equal to the number of C2 failures,
  wherein the codeword check comprises determining that every C1 codeword is legal and every C2 codeword is legal, and wherein decoding is successful in response to a determination that every C1 codeword is legal and every C2 codeword is legal, otherwise decoding is unsuccessful.

14. The computer program product as recited in claim 13, wherein the C1 error correction capability represents a number of C1 errors which are correctable using product codes in the captured data, and wherein the C2 error correction capability represents a number of C2 errors which are correctable using product codes in the captured data.

15. A system for combination error and erasure decoding for product codes, the system comprising a processor and logic integrated with and/or executable by the processor, the logic being configured to:
  read data encoded with a product code from a storage medium to produce captured data;
  generate erasure flags for the captured data and provide the erasure flags to a C2 decoder;
  set a stop parameter to be equal to a length of C1 codewords in a codeword interleave used to encode the captured data; and
  selectively perform, in an iterative process, error or erasure C1 decoding using a C1 decoder followed by error or erasure C2 decoding using the C2 decoder until decoding is successful or unsuccessful.

16. The system as recited in claim 15, wherein each erasure flag corresponds to a portion of the captured data which is to be treated as erased during erasure decoding due to an observed or calculated condition.

17. The system as recited in claim 16, wherein the observed or calculated condition includes at least one of: a header for a codeword interleave not being detected, detection of a phase-locked loop (PLL) cycle slip, a number of detected contiguous illegal modulation codewords within a codeword interleave or C1 codeword at an output of a modulation decoder exceeding a predetermined threshold amount, a number of bits between a Forward Sync pattern and a Re-Sync pattern not being equal to a size of a header and four codeword interleaves, and/ a number of bits between a Re-Sync pattern and a Reverse Sync pattern not being equal to a size of a header and four codeword interleaves.

18. The system as recited in claim 15, wherein the logic configured to selectively perform, in the iterative process, error or erasure C1 decoding followed by error or erasure C2 decoding until decoding is successful or unsuccessful comprises logic configured to:
  perform C1 error decoding on the captured data in a first iteration when the stop parameter is less than or equal to two times a C1 error correction capability minus a C1 decoding margin, otherwise perform C1 erasure decoding on the captured data;
  determine that decoding is successful when a number of C1 failures is equal to zero and the stop parameter equals zero after performing C1 decoding;
  perform C2 error decoding on the captured data after performing C1 decoding when the number of C1 failures is greater than two times a C2 error correction capability minus a C2 decoding margin;
  perform C2 erasure decoding on the captured data after performing C1 decoding when the stop parameter does not equal zero or the number of C1 failures is less than or equal to two times the C2 error correction capability minus the C2 decoding margin and greater than zero;
  determine that decoding is successful after performing C2 decoding when both a number of C2 failures and a number of C1 failures are equal to zero; and
  determine that decoding is unsuccessful after performing C2 decoding when a number of C2 failures is greater than or equal to the stop parameter, otherwise set the stop parameter equal to the number of C2 failures.

19. The system as recited in claim 15, wherein the logic configured to selectively perform, in the iterative process, error or erasure C1 decoding followed by error or erasure C2 decoding until decoding is successful or unsuccessful comprises logic configured to:
  perform C1 error decoding on the captured data in a first iteration when the stop parameter is less than or equal to two times a C1 error correction capability minus a C1 decoding margin, otherwise perform C1 erasure decoding on the captured data;
  stop decoding when a number of C1 failures is equal to zero and perform codeword check;
  perform C2 error decoding on the captured data after performing C1 decoding when the number of C1 failures is greater than two times a C2 error correction capability minus a C2 decoding margin, otherwise perform C2 erasure decoding on the captured data after performing C1 decoding;
  stop decoding after performing C2 decoding when a number of C2 failures is equal to zero; and
  determine that decoding is unsuccessful after performing C2 decoding when a number of C2 failures is greater than or equal to the stop parameter, otherwise set the stop parameter equal to the number of C2 failures,
  wherein the codeword check comprises logic configured to determine that every C1 codeword is legal and every C2 codeword is legal, and wherein decoding is successful when every C1 codeword is legal and every C2 codeword is legal, otherwise decoding is unsuccessful,
  wherein the C1 error correction capability represents a number of C1 errors which are correctable using product codes in the captured data, and
  wherein the C2 error correction capability represents a number of C2 errors which are correctable using product codes in the captured data.

20. The system as recited in claim 15, wherein the logic is further configured to:
  determine which to perform: C1 error decoding or C1 erasure decoding individually for each iteration in the iterative process based on the stop parameter; and
  determine which to perform: C2 error decoding or C2 erasure decoding individually for each iteration in the iterative process based on a number of C1 failures after performing the determined error or erasure C1 decoding.

* * * * *